(12) United States Patent
Kataoka et al.

(10) Patent No.: US 7,287,918 B2
(45) Date of Patent: Oct. 30, 2007

(54) SEMICONDUCTOR LASER MODULE

(75) Inventors: Keiji Kataoka, Ibaraki (JP); Junichi Matsuno, Ibaraki (JP); Yasuyuki Shibayama, Ibaraki (JP); Susumu Monma, Ibaraki (JP); Koji Doi, Ibaraki (JP)

(73) Assignee: Ricoh Printing Systems, Ltd., Tokyo (JP)

( * ) Notice: Subject to any disclaimer, the term of this patent is extended or adjusted under 35 U.S.C. 154(b) by 0 days.

(21) Appl. No.: 11/289,393

(22) Filed: Nov. 30, 2005

(65) Prior Publication Data
US 2006/0140555 A1 Jun. 29, 2006

(30) Foreign Application Priority Data
Dec. 6, 2004 (JP) ............................. P2004-353184

(51) Int. Cl.
*G02B 6/36* (2006.01)
(52) U.S. Cl. ........................................................ 385/93
(58) Field of Classification Search ............. 385/88–94
See application file for complete search history.

(56) References Cited

U.S. PATENT DOCUMENTS 5,550,851 A * 8/1996 Guch et al. .................... 372/33
7,044,661 B2 * 5/2006 Kandar-Kallen et al. ..... 385/94
2004/0240489 A1 * 12/2004 Teramura et al. .............. 372/6

FOREIGN PATENT DOCUMENTS

JP         2003-101116         4/2003

* cited by examiner

*Primary Examiner*—Sarah Song
(74) *Attorney, Agent, or Firm*—McGinn IP Law Group, PLLC

(57) ABSTRACT

In a semiconductor laser module in which light emitted from a packaged semiconductor laser is incident on an optical fiber via a lens, the semiconductor laser, the lens, the optical fiber, and a holding member which holds the optical fiber are disposed in an integrated module structure, and at least one space in the module has a flow path communicating with an ambient air via an adsorbent.

18 Claims, 1 Drawing Sheet

SEMICONDUCTOR LASER MODULE

BACKGROUND OF THE INVENTION

1. Field of the Invention

The present invention relates to a semiconductor laser module.

2. Description of the Related Art

In a semiconductor laser module having an optical fiber coupling system in which light emitted from a packaged semiconductor laser is guided by a lens to an optical fiber, a core portion of the optical fiber along which the light propagates has a section size which is as small as several microns. When dust adheres to the core portion of an end face of the optical fiber, the transmission efficiency of light is largely lowered. A method of preventing dust from being produced in a light incident end face of an optical fiber has been proposed.

In a related art, even when an adhesive agent, a cleaning agent, a flux for soldering, or the like used in a process of assembling a semiconductor laser module remains in the module in a very small amount on the order of ppm, adherence or adsorption of such dust to an optical component possibly occurs. A method is known in which an optical fiber coupling system of a semiconductor laser module is hermetically isolated and sealed from the ambient air, and organics existing in the atmosphere inside the semiconductor laser module are caused to adhere to or to be adsorbed to an organic adsorbent such as activated charcoal (for example, see JP-A-2003-101116).

In the related art, since the optical fiber coupling system is isolated from the ambient air, however, there may arise the following problems (1) to (3).

(1) When the semiconductor laser module is used at a high or low altitude, a pressure difference is produced between the ambient air and the inside to deform the optical fiber coupling system, thereby causing variation of the transmission efficiency of light.

(2) When the semiconductor laser module is used at a high or low altitude, a pressure difference is produced between the ambient air and the inside to cause leakage in an incomplete hermetic sealing portion of the optical fiber coupling system, whereby a substance which may cause contamination is allowed to enter from the outside.

(3) When the humidity of the ambient air is high, moisture enters the inside through an incomplete hermetic sealing portion of the optical fiber coupling system. Even after the ambient humidity is lowered, the entering moisture stays inside, a change of the ambient temperature causes the moisture to condense to form dew, thereby adversely affecting the optical fiber coupling system.

There is another problem in that powder due to the adhesive agent scatters, and the optical system is contaminated, thereby lowering the transmission efficiency of light.

SUMMARY OF THE INVENTION

It is an object of the invention to provide a semiconductor laser module which is individually packaged, and in which optical properties can be prevented from being impaired by adherence or adsorption of a foreign substance to the surface of an optical component.

According to an aspect of the invention, there is provided with a semiconductor laser module in which light emitted from a packaged semiconductor laser is incident on an optical fiber via a lens, wherein the semiconductor laser, the lens, the optical fiber, and a holding member which holds the optical fiber are disposed in an integrated module structure, and at least one space in the module comprises a flow path communicating with an ambient air via an adsorbent.

It is possible to provide a semiconductor laser module in which optical properties can be prevented from being impaired by adherence or adsorption of a foreign substance to the surface of an optical component.

DESCRIPTION OF THE PREFERRED EMBODIMENTS

Figure 1:
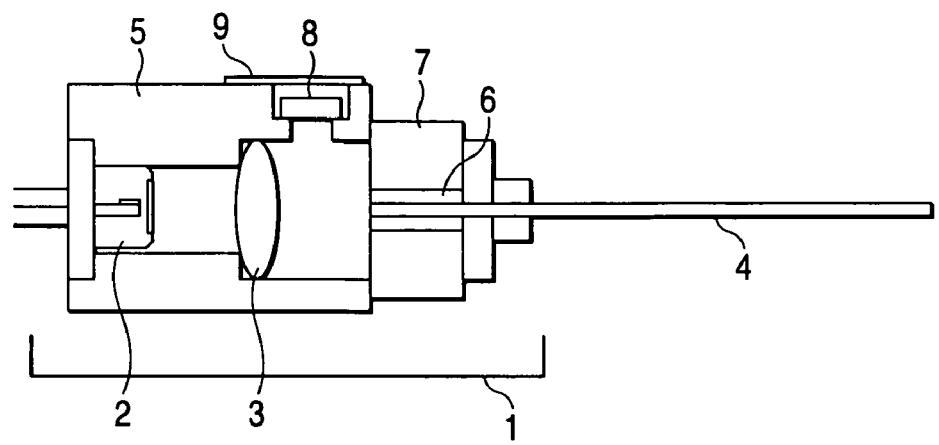
FIG. 1 is a diagram of a semiconductor laser module which is an embodiment of the invention.

FIG. 1 is a diagram of a section of a semiconductor laser module 1 according to an embodiment.

An optical fiber coupling optical system includes a packaged semiconductor laser 2, a lens 3, and an optical fiber 4. The semiconductor laser 2 emits light of a wavelength of 405 nm, and a light spot is formed at a predetermined magnification by the lens 3 in a core portion of a light incident end face of the optical fiber 4. Light entering the optical fiber 4 propagates in the core portion (not shown) of the optical fiber 4. In the optical fiber 4 used in the embodiment, the core has a diameter of 5 μm, and the fiber surrounding the core has a diameter of 125 μm.

The semiconductor laser module 1 comprises: a holding portion 5 for holding the optical fiber coupling optical system; a ferrule 6 for holding the optical fiber 4: a ferrule holding portion 7 for holding the ferrule 6; an adsorbent 8; and a seal 9 for forming a flow path. The adsorbent and the seal are features of the embodiment.

The adsorbent 8 is adhered to a through hole of the holding portion 5 as shown in FIG. 1. The through hole is closed by the seal 9, and a flow path is formed in the seal 9 as described below. The ambient air can slightly pass the flow path and enter a space between the lens 3 and the optical fiber 4 in the semiconductor laser module 1, etc. The ambient air never enters the optical fiber coupling optical system without passing the adsorbent 8. Namely, outside contaminated air passes the adsorbent 8, and, as clean air, enters the interior of the semiconductor laser module.

In this way, the air pressure in the semiconductor laser module can be always made substantially equal to the pressure of the ambient air. There is no pressure difference between the interior air and exterior air of the semiconductor laser module. Consequently, it is possible to largely reduce the chance that, even when a leakage path other than the flow path is caused, outside contaminated air directly enters the interior through the leakage path.

The adsorbent 8 effectively adsorbs traces of gases emitted from structural members in the semiconductor laser module, and prevents the optical components such as the end face of the optical fiber 4 from contamination, which is caused by the reaction of the residual gases with laser light.

Figure 2:
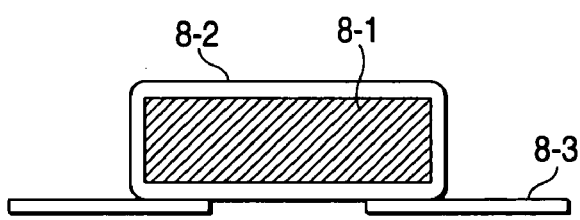
FIG. 2 is a diagram of an adsorbent used in the embodiment of the invention.

FIG. 2 shows the section structure of the adsorbent 8 shown in FIG. 1. Activated charcoal 8-1 is covered with a porous fluorine sheet 8-2, the surface of which has many holes of submicron diameter. The porous fluorine sheet 8-2 allows air to pass therethrough, and prevents fragment of the internal activated charcoal 8-1 from scattering to the outside.

The reference numeral 8-3 denotes an air-impermeable sheet. An adhesive member is applied to the rear face of the sheet, and hence the sheet can be bonded to the holding portion 5 as shown in FIG. 1.

Figure 3A:
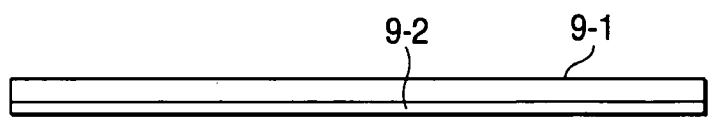
FIGS. 3A and 3B are diagrams of a seal used in the embodiment of the invention.
Figure 3B:
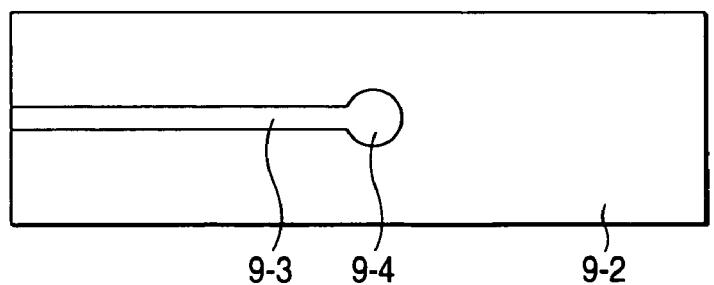

FIG. 3 shows a side view of the seal 9 shown in FIG. 1, and a plan view as seen from the rear side. FIG. 3A is the side view, and FIG. 3B is the plan view.

The reference numeral 9-1 denotes an aluminum sheet to the rear face of which an adhesive member 9-2 is applied. A flow path 9-3 and an air inflow port 9-4 are formed by peeling off the adhesive member 9-2 with leaving the sheet 9-1 on the surface side.

In the above description, the adsorbent 8 includes the activated charcoal 8-1. Alternatively, silica gel which is effective for moisture, or a mixture of silica gel and another substance may be used. Another adsorbing material containing another synthetic material may be used.

The semiconductor laser module according to the embodiment can be applied to a printing apparatus which performs recording on a photosensitive material (a film or a photosensitive member which is usable in a laser printer).

In the case where a semiconductor laser has a short wavelength of 450 nm or less, particularly, laser light exhibits a strong photochemical reaction with an organic gas. Therefore, it is important to prevent the optical properties from being lowered by contamination such as adherence or adsorption of a foreign substance to the surface of an optical component. In a semiconductor laser module which guides light to an optical fiber, a density of the light intensity is very high in the optical fiber, and hence an effect due to contamination is particularly prominent. According to the embodiment, optical properties can be prevented from being impaired by adherence or adsorption of a foreign substance, and therefore it is possible to realize a semiconductor laser module which is highly reliable.

What is claimed is:

1. A semiconductor laser module comprising:
   a packaged semiconductor laser;
   a lens;
   an optical fiber on which light emitted from the packaged semiconductor laser is incident via the lens; and
   a holding member holding the optical fiber, wherein said semiconductor laser, said lens, said optical fiber, and said holding member are disposed in an integrated module structure of the semiconductor laser module, and
   an adsorbent disposed in an air passage formed between an exterior of the semiconductor laser module and a space provided in said integrated module structure.

2. A semiconductor laser module according to claim 1, wherein said adsorbent includes activated charcoal which is covered with a porous fluorine sheet.

3. A semiconductor laser module according to claim 1, wherein the light emitted from said semiconductor laser bas a wavelength of 450 nm or less.

4. A semiconductor laser module according to claim 1, wherein the semiconductor laser module is provided in an printing apparatus which performs recording on a photosensitive material.

5. A semiconductor laser module according to claim 1, wherein the integrated module structure further comprises a holding portion having a recess and the adsorbent is disposed in the recess.

6. A semiconductor laser module according to claim 1, farther comprising a non-hermetic seal disposed on a surface of the holding member.

7. A semiconductor Laser module according to claim 5, further comprising a seal disposed over an opening of the recess.

8. A semiconductor laser module according to claim 7, wherein the seal comprises at least one of an air inlet port and an air flow path to allow ambient air to pass from outside of the integrated module structure in to the integrated module structure.

9. A semiconductor laser module according to claim 7, wherein the seal comprises an adhesive member on a surface of the seal.

10. A semiconductor laser module according to claim 7, wherein the seal is bonded to a portion of the holding member.

11. A semiconductor laser module according to claim 6, wherein the non-hermetic seal comprises aluminum.

12. A semiconductor laser module according to claim 7, wherein the seal comprises aluminum.

13. A semiconductor laser module according to claim 6, wherein the non-hermetic seal comprises a releasable sheet disposed on the adhesive member.

14. A semiconductor laser module according to claim 7, wherein the seal comprises a releasable sheet disposed or the adhesive member.

15. A semiconductor laser module according to claim 1, wherein the adsorbent comprises a silica gel.

16. A semiconductor laser module according to claim 1, wherein the adsorbent is adhered to the holding member.

17. A semiconductor laser module according to claim 2, wherein an air impermeable sheet is disposed between a portion of the porous fluorine sheet and the holding member.

18. A semiconductor laser module according to claim 17, wherein the air impermeable sheet includes an adhesive member.

* * * * *